(12) United States Patent
Pezeshki et al.

(10) Patent No.: US 6,782,013 B2
(45) Date of Patent: Aug. 24, 2004

(54) WAVEGUIDE WAVELENGTH LOCKER

(75) Inventors: Bardia Pezeshki, Redwood City, CA (US); Edward C. Vail, Menlo Park, CA (US)

(73) Assignee: JDS Uniphase Corporation, San Jose, CA (US)

( * ) Notice: Subject to any disclaimer, the term of this patent is extended or adjusted under 35 U.S.C. 154(b) by 109 days.

(21) Appl. No.: 09/912,876

(22) Filed: Jul. 25, 2001

(65) Prior Publication Data

US 2003/0021304 A1 Jan. 30, 2003

(51) Int. Cl.[7] .............................. H01S 3/10; G02B 6/26
(52) U.S. Cl. ........................................ 372/20; 385/39
(58) Field of Search ............................... 372/18, 20, 39

(56) References Cited

U.S. PATENT DOCUMENTS

| | | | | |
|---|---|---|---|---|
| 5,500,916 A | * | 3/1996 | Cirelli et al. .................. 385/37 |
| 5,959,292 A | * | 9/1999 | Duveneck et al. ..... 250/227.11 |
| 5,973,824 A | * | 10/1999 | Sanghera et al. ............ 359/342 |
| 6,078,705 A | * | 6/2000 | Neuschafer et al. ........... 385/12 |
| 6,088,147 A | * | 7/2000 | Weber et al. ................ 359/237 |
| 6,212,323 B1 | * | 4/2001 | Harpin et al. .................. 385/39 |
| 6,245,412 B1 | * | 6/2001 | Choquette et al. .......... 428/156 |
| 2003/0026301 A1 | * | 2/2003 | Pianciola et al. ............. 372/18 |
| 2003/0048991 A1 | * | 3/2003 | Gonthier ...................... 385/39 |

* cited by examiner

*Primary Examiner*—Don Wong
*Assistant Examiner*—James Menefee
(74) *Attorney, Agent, or Firm*—Allen, Dyer, Doppelt, Milbrath & Gilchrist, P.A.

(57) ABSTRACT

A tunable laser module includes a laser operating at a first wavelength. A wavelength locker includes a planar silica waveguide that is coupled to the laser. The wavelength locker provides an error signal that is used to tune the first wavelength of the laser to a desired wavelength. The wavelength locker and one or more detector(s) generate the error signal based on a difference between the first wavelength value and the desired wavelength value. A controller is connected to the waveguide wavelength locker and the laser. The controller generates a laser control signal based on the error signal that adjusts the first wavelength. The waveguide wavelength locker can alternately include first and second spaced gratings, Mach-Zehnder interferometers with different asymmetries, passive waveguide(s), and combinations thereof. The laser is mounted on a first temperature controlled package and the waveguide wavelength locker is mounted on the first temperature controlled package.

17 Claims, 5 Drawing Sheets

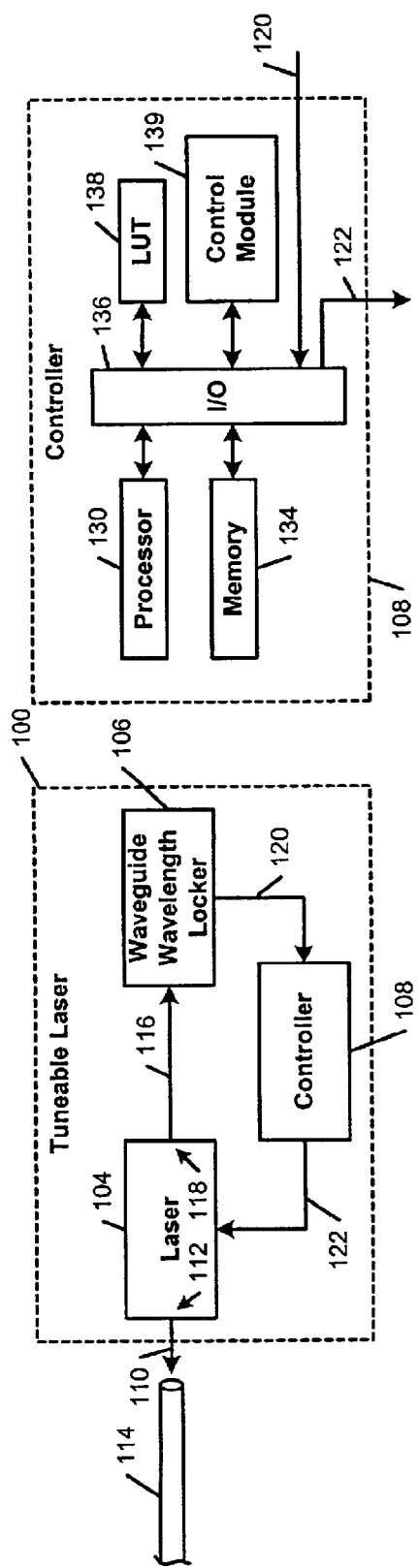
Fig. 5
Fig. 4
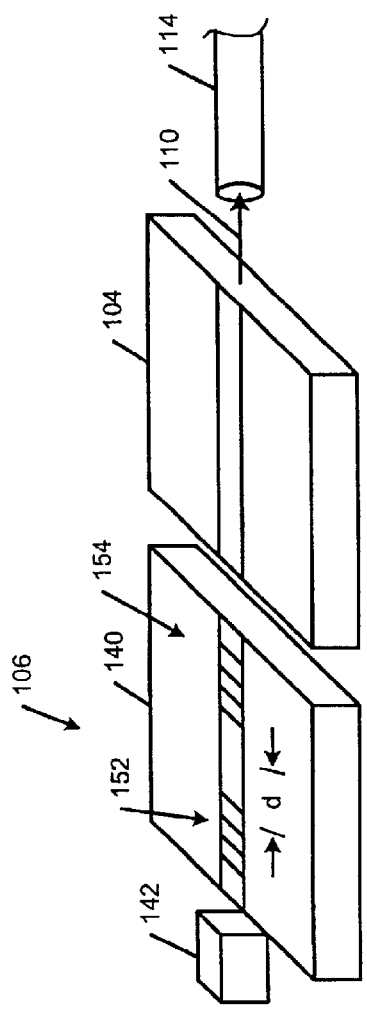
Fig. 6

WAVEGUIDE WAVELENGTH LOCKER

FIELD OF THE INVENTION

The present invention relates to wavelength lockers for tunable lasers, and more particularly to a wavelength locker including a planar waveguide.

BACKGROUND OF THE INVENTION

Wavelength lockers are required for wavelength division multiplexing (WDM) systems with narrow channel spacings. Wavelength lockers are particularly important for tunable lasers, particularly when the tunable lasers need to lock to multiple wavelength channels. Ideally, a wavelength locker is capable of locking multiple channels. In addition to tunable lasers, there are many other applications that require an optical signal to have a stable wavelength within predetermined limits. Transmission of multiple signals having different stable wavelengths allows the transmission of different channels.

Commercially available devices that perform the function of wavelength locking are costly, complicated, and need very precise alignment. Some conventional wavelength lockers are based on fiber gratings or Fabry-Perot etalons. Since the fiber gratings are narrow band and generally made serially in a fiber, they can lock onto only one or a few channels. For example, a tunable laser with 12 nm tuning range can access 32 channels that are spaced 50 GHz apart. A fiber grating that locks onto all of the channels needs to have 32 separate fiber gratings, which is difficult and costly to implement.

Alternatively, a bulk Fabry-Perot etalon having a precise thickness and resonances at multiple wavelengths can be employed. For example, U.S. Pat. No. 5,798,859, which is hereby incorporated by reference, discloses a wavelength locker for a tunable laser module that employs a bulk Fabry-Perot etalon. The wavelength locker is compact and can be integrated into the laser package. A temperature insensitive etalon is fabricated by using a combination of materials with low or zero coefficients of thermal expansion. This obviates the need for additional temperature stabilization but requires extremely precise alignment to set the wavelength of the etalon. Alternatively, if a solid material is used during fabrication, the etalon will have some temperature sensitivity and must be temperature stabilized. The precise wavelength can be adjusted by varying the operating temperature set point.

An exemplary wavelength locker implementation includes a Fabry-Perot etalon for a 12 nm tunable laser with 50 GHz channel spacing. For both temperature insensitive and sensitive packages, the exact channel spacing is fine-tuned by adjusting the tilt of the etalon relative to the incident light. For example, a 2 mm thick piece of quartz has a channel spacing of 51 GHz. The channel spacing can be adjusted to 50 GHz by tilting the etalon to an angle of 13.26 degrees. To keep the channels aligned within $\frac{1}{10}$ of the channel spacing over 12 nm, the spacing must be held within $\frac{1}{10} \times \frac{1}{32}$ of the channel spacing (or about 0.16 GHz). This requires a tilt alignment accuracy within 0.1 degrees. For the temperature insensitive package, the absolute wavelength is also adjusted by tilting the elaton. For $\frac{1}{10}$ channel spacing, the tilt alignment must be within $\frac{1}{200}$ of a degree accuracy. The temperature sensitive package can be set by controlling the operating temperature. When quartz is used, the operating temperature must be controlled with an accuracy of 4° C. In either case, the exact alignment of the etalon has proven to be difficult. Even when the temperature sensitive package is employed, obtaining alignment within 0.1 degrees can be difficult to achieve.

SUMMARY OF THE INVENTION

A tunable laser according to the invention includes a laser operating at a first wavelength. A wavelength locker includes a planar waveguide that is coupled to the laser. The wavelength locker tunes the laser to a first wavelength value.

In other features of the invention, the waveguide wavelength locker includes a detector. The wavelength locker and the detector generate an error signal based on a difference between the first wavelength value and a desired wavelength value. A controller is connected to the waveguide wavelength locker and the laser. The controller generates a laser control signal based on the error signal. The laser control signal adjusts the first wavelength value to the desired wavelength value.

In other features of the invention, the waveguide wavelength locker includes a glass waveguide with a first strong grating that is spaced from a second strong grating to form a Fabry-Perot cavity.

In yet other features of the invention, the waveguide wavelength locker includes a passive waveguide that is connected to a Mach-Zehnder interferometer having first and second arms with unequal lengths. The Mach-Zehnder interferometer is connected to a first detector. The first detector generates an alternating signal with peaks that are spaced as a function of wavelength. A grating is connected to a second detector. The second detector generates a reference signal having a peak at a fixed wavelength. The waveguide wavelength locker further includes a passive waveguide that is connected to a third detector. The third detector generates a normalization signal. The controller receives the alternating signal, the reference signal and the normalization signal and generates the control signal therefrom.

In other features, the laser is mounted on a first temperature controlled package and the waveguide wavelength locker is mounted on the first temperature controlled package.

In still other features, the waveguide wavelength locker includes first, second and third Mach-Zehnder interferometers with different asymmetries. The first, second and third Mach-Zehnder interferometers are connected to first, second and third detectors. A passive coupler is connected to a fourth detector. The first, second, third and fourth detectors are connected to the controller. The controller uses outputs of the first, second, third and fourth detectors to access a lookup table for faster wavelength measurement.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 4 is a functional block diagram illustrating a tunable laser with a waveguide wavelength locker according to the present invention;

FIG. 5 illustrates an exemplary controller for the waveguide wavelength locker of FIG. 4;

FIG. 6 illustrates a first embodiment of the waveguide wavelength locker that includes a planar waveguide with spaced gratings;

DETAILED DESCRIPTION OF THE PREFERRED EMBODIMENTS

The following description of the preferred embodiment(s) is merely exemplary in nature and is in no way intended to limit the invention, its application, or uses.

Figure 1:
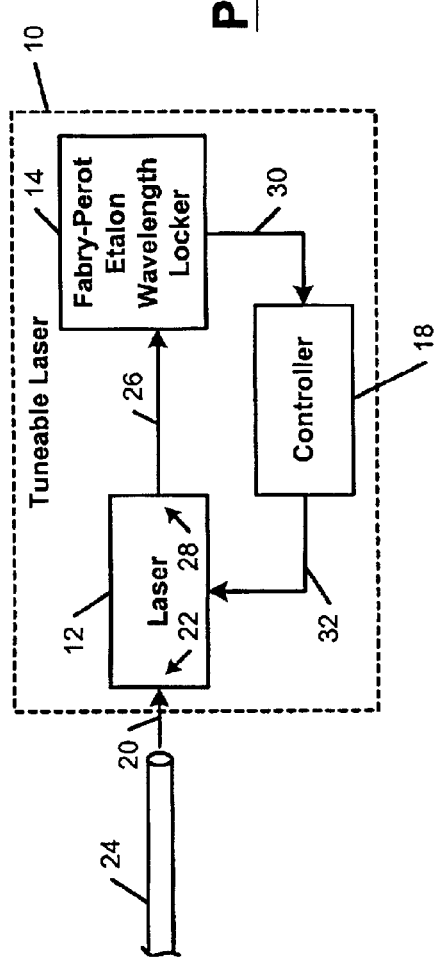
FIG. 1 is a functional block diagram illustrating a tunable laser including a wavelength locker with a Fabry-Perot elaton according to the prior art.

Referring now to FIG. 1, a tunable laser module 10 according to the prior art includes a laser 12 and a wavelength locker 14. A controller 18 may be packaged with the tunable laser module 10 and/or the wavelength locker 14 or packaged separately. The laser 12 generates a primary beam of light 20 at an output 22 onto fiber 24 and a secondary beam of light 26 having relatively low power at a tap 28. The primary and secondary beams of light 20 and 26 have a wavelength ($\lambda$). Using the secondary beam of light 26, the wavelength locker 14 generates one or more error signals 30 that are output to the controller 18. The error signals are related to a difference between the wavelength value ($\lambda$) of the laser 12 and a desired wavelength value ($\lambda_d$). The controller 18 generates a control signal 32 that adjusts the wavelength value ($\lambda$) to the desired wavelength value ($\lambda_d$).

Figure 2:
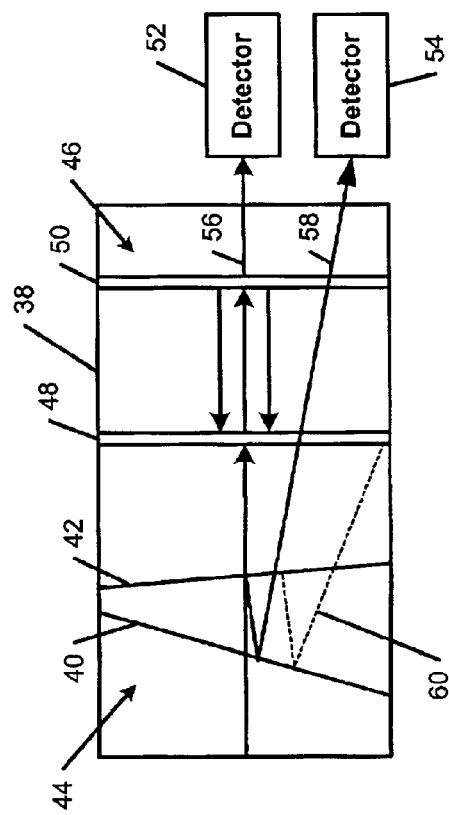
FIG. 2 illustrates the Fabry-Perot etalon of FIG. 1 in further detail.

Conventional wavelength lockers 14 are typically fabricated using Fabry-Perot etalons. Referring now to FIG. 2, a monolithic device 38 is shown having partially transmitting mirrors 40 and 42 that form a wedge 44 at an angle. Adjacent to and spaced from the wedge 44 is an etalon 46 that is formed by two spaced, partially-reflecting mirrors 48 and 50. First and second detectors 52 and 54 that are separated to detect beams 56 and 58.

Figure 3A:
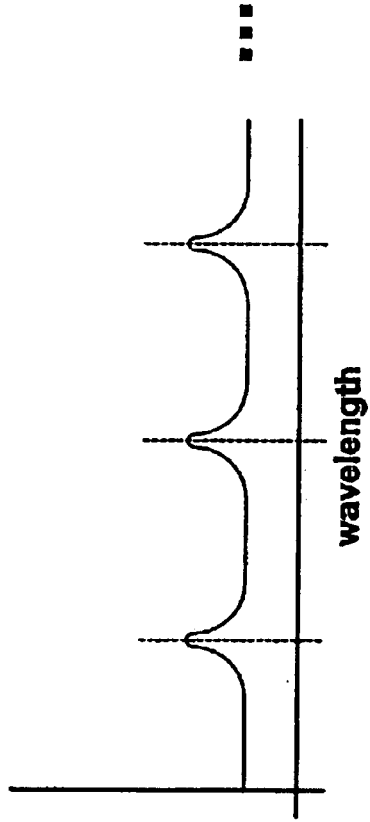
FIGS. 3A–3C illustrate wavelength-dependent characteristics associated with the Fabry-Perot etalon of FIG. 2.
Figure 3B:
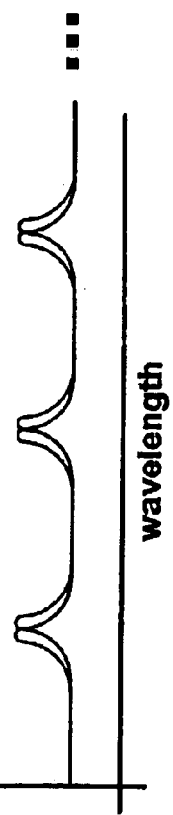
Figure 3C:
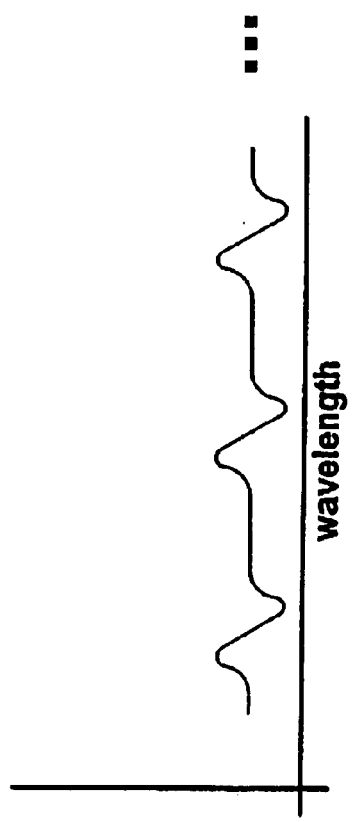

The beams 56 and 58 pass through the etalon 46 at different angles. The response of the first detector 52 is illustrated in FIG. 3A. Because of the different angles of the beams 56 and 58, the output signals of the detectors 52 and 54 are spaced as is illustrated in FIG. 3B. The beam 58 moves through the etalon at an angle and has transmission peaks at shorter wavelengths as compared to the beam 56 that travels close to perpendicular. Some light that is represented by dotted line 60 is not coupled into either of the detectors 52 and 54 and is lost. Feedback circuitry integrated with the wavelength locker 14 or the controller 18 is provided in the form a comparator circuit (not shown) or an equivalent circuit that compares the detected intensities at the two detectors 52 and 54. For example, a difference signal shown in FIG. 3C can be used. When the ratio of the intensities varies more than a predetermined amount from a pre-established ratio determined during pre-calibration, the wavelength of the input signal is adjusted accordingly. As can be appreciated, the wavelength locker 14 requires precise alignment and parallelism of the mirrors 48 and 50 and the wedge 44.

Referring now to FIG. 4, a tunable laser module according to the present invention is shown and is generally designated 100. The tunable laser module 100 includes a laser 104 and a waveguide wavelength locker 106. A controller 108 may be packaged with the tunable laser module 100 and/or the wavelength locker 106 or packaged separately. The laser 104 generates a primary beam of light 110 at an output 112 onto an output fiber 114 and a secondary beam of light 116 having relatively lower power at a tap 118. The primary and secondary beams of light 110 and 116 have wavelength value ($\lambda$). Using the secondary beam of light 116, the wavelength locker 106 generates one or more error signals 120 that are output to the controller 108. The error signal 120 is related to the difference between the wavelength value ($\lambda$) of the laser 104 and a desired wavelength value ($\lambda_d$). The controller 108 generates a control signal 122 that is output to the laser 104 to adjust the wavelength value ($\lambda$) to the desired wavelength value ($\lambda_d$).

Referring now to FIG. 5, an exemplary controller 108 is shown in further detail. The controller 108 includes a processor 130 and memory 134. Memory 134 can be read only memory (ROM), random access memory (RAM), flash memory, or any other suitable electronic storage. The processor 130 and the memory 134 are connected to an input/output (I/O) interface 136. The I/O interface 136 is connected to the waveguide wavelength locker 106 to receive the error signal(s) 120. The I/O interface 136 is also connected to the laser 104 to output the control signal 122. One or more lookup tables (LUT) 138 and a control module 139 are associated with the controller 108. The LUT 138 will be described below in conjunction with FIGS. 9 and 10. The control module 139 contains logic for interpreting the error signal(s) 120 and for generating the control signal 122.

Referring now to FIG. 6, an exemplary implementation of the tunable laser module 100 is illustrated. The waveguide wavelength locker 106 includes a planar waveguide wavelength locker 140 that preferably contains silica and a detector 142 that is coupled to the planar waveguide wavelength locker 140. Advantageously, the planar waveguide wavelength locker 140 that is fabricated with a planar silica waveguide provides accurate locking without the need for adjustment for parallelism or other orientation. For wavelength locking, accurate coupling to the waveguide 140 is not required since very little optical power is needed for the control feedback loop.

In the exemplary implementation that is illustrated in FIG. 6, the planar waveguide wavelength locker 140 is positioned at the rear of the tunable laser chip or at the tap 118 where sufficient power is available. The alignment can be very rough since only a very small amount of power needs to be coupled into the planar waveguide wavelength locker 140. In fact, poor alignment may be important to prevent feedback into the laser 104 that may tend to destabilize the laser 104. Relatively slow, cheap detectors 142 can easily measure −70 dBm power levels where there is negligible feedback into the laser 104. Careful angular alignment is not required since the material and lithographic parameters determine the effective index of the waveguide mode and the associated wavelength resonances. These parameters can be precisely determined in the fabrication process and adjusted by temperature tuning in the final package if necessary. Alternative post fabrication tuning techniques can be used such as ultraviolet (UV) irradiation, controlled etching or deposition, or adjustment of strain.

The planar waveguide wavelength locker 140 has one or more frequency discriminating elements. The simplest discriminating elements are an equivalent of the Fabry-Perot resonator that is used in the bulk Fabry-Perot version. Two strong gratings 152 and 154 act as broadband reflectors and are spaced a precise distance d apart. Unlike optical fibers that include gratings that are produced by UV irradiation and are narrowband, integrated optics gratings are preferably etched and easily span a 12 nm tuning range. Alternatively, Mach-Zehnder interferometers with unequal path lengths can be implemented with similar periodic resonances and frequencies.

One or more detectors 142 are located at an output of the frequency-selective waveguide. By taking a ratio of the connected laser power to the received power, an error signal can be generated that depends on the wavelength value. The error signal is then used to vary the temperature of the laser in a control feedback loop. If more than one detector is used with differing wavelength response at each detector, then the ratio of these two powers can be used to generate the error signal.

Figure 7:
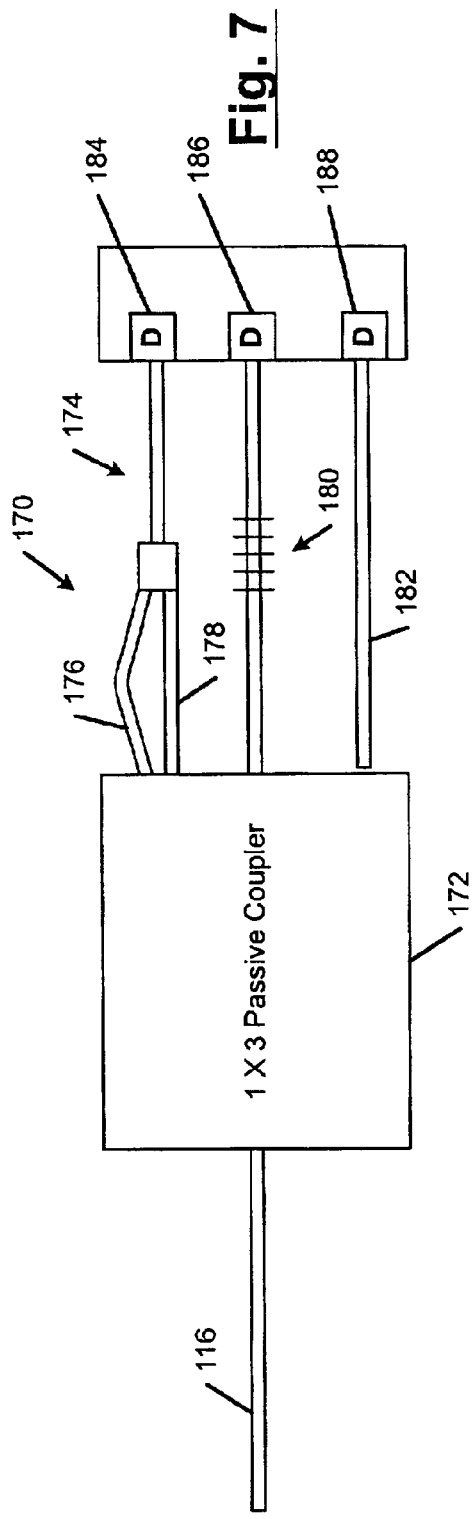
FIG. 7 illustrates a second embodiment of the waveguide wavelength locker that includes a Mach-Zehnder interferometer, a grating, and a passive coupler.
Figure 8:
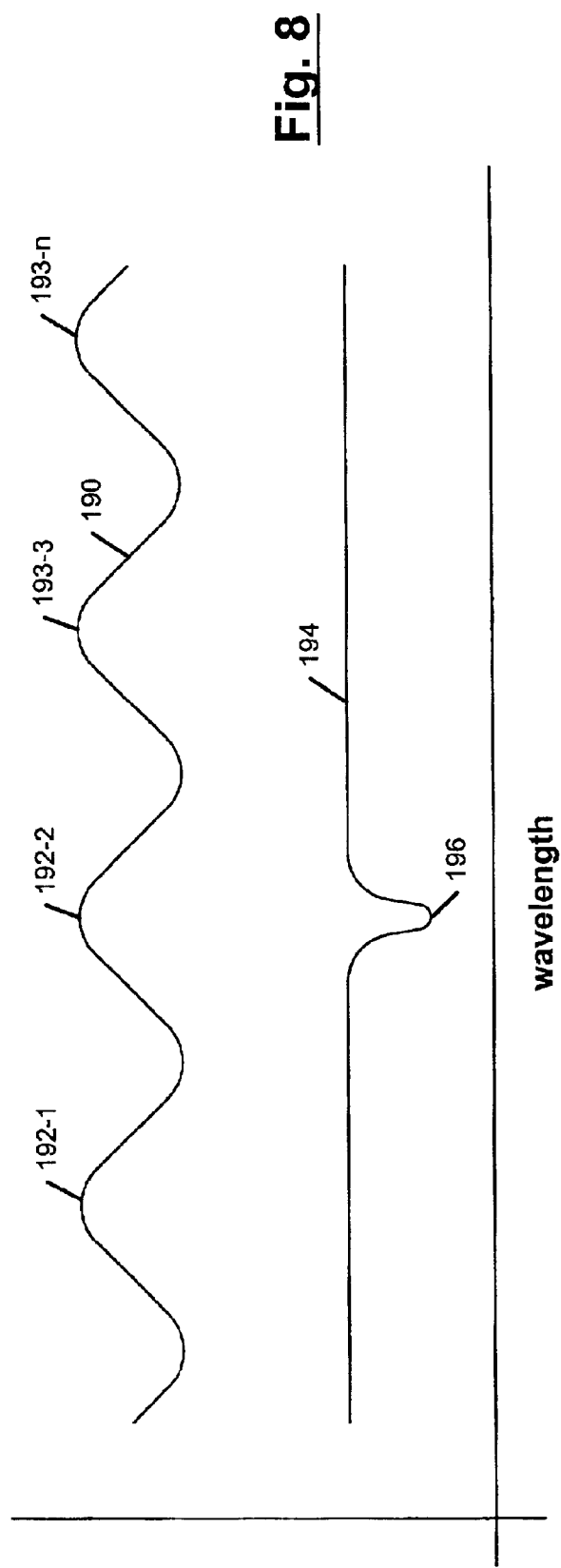
FIG. 8 illustrates wavelength-dependent characteristics that are associated with the waveguide wavelength locker of FIG. 7.

Referring now to FIGS. 7 and 8, a second waveguide wavelength locker is illustrated and is generally designated 170. The waveguide wavelength locker 170 includes a passive (1×3) splitter 172, a Mach-Zehnder interferometer 174 with unequal arms 176 and 178, a waveguide with a grating 180 for providing a wavelength reference value, and a broadband waveguide 182 for monitoring and normalizing the power. Detectors 184, 186 and 188 are coupled to the Mach-Zehnder interferometer 174, the grating waveguide 80, and the passive waveguide 182, respectively.

The Mach-Zehnder interferometer 174 generates an alternating waveform 190 with peaks 192-1, 192-2, 192-3, ..., 192-n that correspond to the free spectral range (FSR). The waveform 190 does not specifically identify a particular wavelength value. The grating 180 generates a reference waveform 194 having a negative peak 196 at a particular wavelength value to provide an absolute wavelength reference value. The waveform of the passive waveguide 182 provides a measurement of total power or a monitor photodiode (MPD) signal that is typically used to normalize the other signals.

Figure 9:
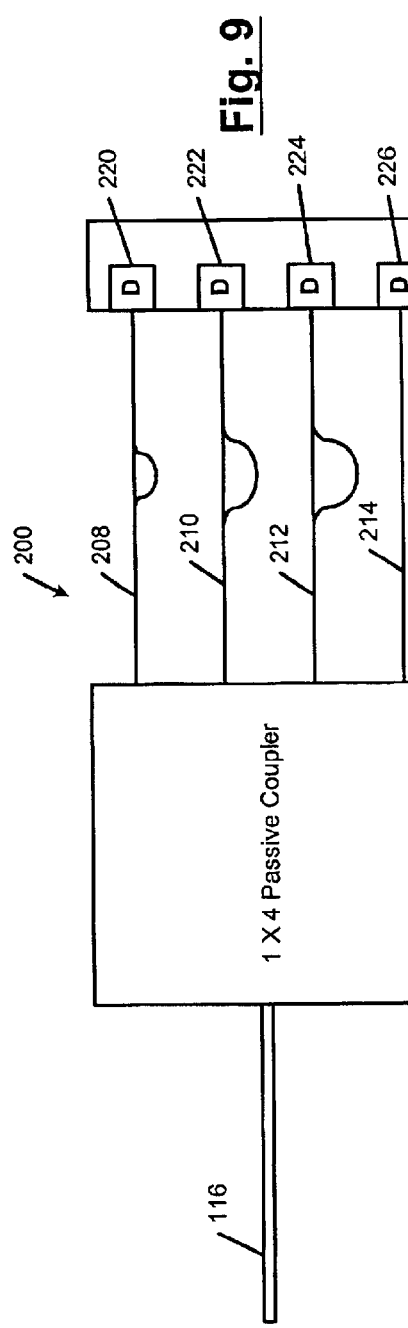
FIG. 9 illustrates a third embodiment of the waveguide wavelength locker that includes multiple Mach-Zehnder interferometers with different asymmetries.
Figure 10:
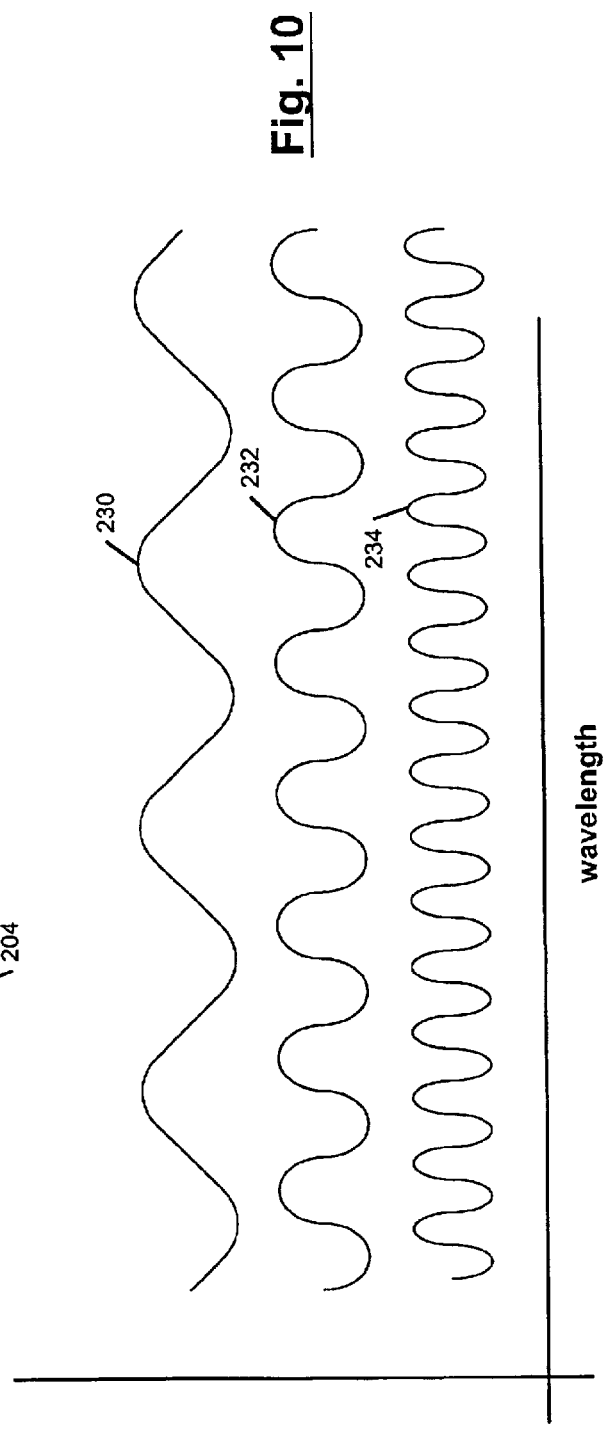
FIG. 10 illustrates wavelength-dependent characteristics that are associated with the waveguide wavelength locker of FIG. 9.

Referring now to FIGS. 9 and 10, a third waveguide wavelength locker 200 is illustrated and includes a 1×4 splitter 204, three Mach-Zehnder interferometers 208, 210 and 212 having different asymmetries or differently spaced arms, and a passive waveguide 214. Note that the symbol used to identify the Mach-Zehnder interferometers in FIG. 9 is a simplified version of the symbol used in FIG. 7. The Mach-Zehnder interferometers in FIGS. 7 and 9 operate similarly. The Mach-Zehnder interferometers 208, 210 and 212 and the passive waveguide 214 are connected to detectors 220, 222, 224, and 226, respectively.

The waveforms 230, 232 and 234 illustrate the response of the Mach-Zehnder interferometers 208, 210 and 212, respectively after being normalized by a reference signal transmitted by the passive waveguide 214. Assuming that the asymmetry of a subsequent Mach-Zehnder is different than that of a prior Mach-Zehnder, the three Mach-Zehnder waveforms create a unique signal that is used to identify particular wavelength value. The lookup table (LUT) is used to identify the wavelength value from the Mach-Zehnder waveforms. In other words, the values of the Mach-Zehnder waveforms are used to access the LUT to determine the wavelength value. In a preferred embodiment, the spacing of the Mach-Zehnder arms is double. In other words, the second Mach-Zehnder spacing is double the first Mach-Zehnder spacing and the third Mach-Zehnder spacing is double the second Mach-Zehnder spacing. However, the spacing does not have double. Any series of Mach-Zehnders with different arm lengths can be used with the LUT to generate the absolute wavelength.

In a preferred embodiment, the waveguide wavelength locker is packaged on the same platform or submount as the tunable laser. As a result, the wavelength can be corrected for temperature using the same temperature control platform as the tunable laser chip.

As can be appreciated from the foregoing, the waveguide wavelength locker according to the present invention reduces or eliminates the problems of alignment that were associated with conventional wavelength lockers. As a result, the manufacturing costs and reliability of the wavelength lockers has been significantly improved.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A tunable laser module comprising:

a laser operating at a first wavelength value; and a wavelength locker fabricated from a planar waveguide and coupled to said laser for tuning said first wavelength value of said laser to a desired wavelength value, wherein said wavelength locker includes a passive waveguide connected to a Mach-Zender interferometer having first and second arms with unequal lengths, wherein said Mach-Zender interferometer is connected to a first detector.

2. The tunable laser module of claim 1 wherein said waveguide wavelength locker further includes a grating connected to a second detector.

3. The tunable laser module of claim 2 wherein said second detector generates a reference signal having a peak at a fixed wavelength value.

4. The tunable laser module of claim 3 wherein said waveguide wavelength locker further includes a passive coupler that is connected to a third detector.

5. The tunable laser module of claim 4 wherein said third detector generates a normalization signal.

6. The tunable laser module of claim 5 wherein said controller receives said alternating signal, said reference signal and said normalization signal and generates a laser control signal therefrom.

7. A tunable laser module comprising:

a laser operating at a first wavelength value; and a wavelength locker fabricated from a planar waveguide and coupled to said laser for tuning said first wavelength value of said laser to a desired wavelength value, wherein said wavelength locker includes first, second, and third Mach-Zender interferometers with different asymmetries, wherein said first, second, and third Mach-Zender interferometers are connected to first, second, and third detectors.

8. The tunable laser module of claim 7 wherein said second Mach-Zehnder interferometer has a frequency response that is different than that of said first Mach-Zehnder interferometer and said third Mach-Zehnder interferometer has a frequency response that is different than that of said second Mach-Zehnder interferometer.

9. The tunable laser module of claim 8 further comprising a passive broadband waveguide connected to a fourth detector.

10. The tunable laser module of claim 9 wherein said first, second, third and fourth detectors are connected to a controller and wherein said controller addresses a lookup table using outputs of said first, second and third Mach-Zehnder interferometers.

11. A wavelength locker for a tunable laser module, comprising:
a splitter that receives light from the laser module and splits it between multiple light paths;
a first Mach-Zehnder interferometer that receives light from the splitter and has a first arm asymmetry; and
a second Mach-Zehnder interferometer that receives light from the splitter and has a second arm asymmetry, wherein the splitter, the first Mach-Zender interferometer and the second Mach-Zender interferometer are all formed on a single planar waveguide substrate.

12. The wavelength locker of claim 11 further comprising:
a third Mach-Zehnder interferometer formed on the planar waveguide substrate that receives light from the splitter and has a third arm asymmetry.

13. The wavelength locker of claim 12 further comprising:
a first detector coupled to said first Mach-Zehnder interferometer;
a second detector coupled to said second Mach-Zehnder interferometer; and
a third detector coupled to said third Mach-Zehnder interferometer.

14. The wavelength locker of claim 13 wherein said second Mach-Zehnder interferometer has a frequency response that is different than said first Mach-Zehnder interferometer and said third Mach-Zehnder interferometer has a frequency response that is different than said second Mach-Zehnder interferometer.

15. The wavelength locker of claim 14 further comprising a passive waveguide connected to a fourth detector.

16. The wavelength locker of claim 15 wherein said first, second, third and fourth detectors are connected to a controller and wherein said controller normalizes first, second and third signals generated by said first, second, and third detectors using a fourth signal generated by said fourth detector.

17. The wavelength locker of claim 16 wherein said controller accesses a lookup table using outputs of said first, second and third detectors.

* * * * *

UNITED STATES PATENT AND TRADEMARK OFFICE
CERTIFICATE OF CORRECTION

PATENT NO. : 6,782,013 B2
DATED : August 24, 2004
INVENTOR(S) : Pezeshki et al.

It is certified that error appears in the above-identified patent and that said Letters Patent is hereby corrected as shown below:

Column 5,
Line 37, "80, and the passive" should read -- 180, and the passive --

Signed and Sealed this

Third Day of May, 2005

JON W. DUDAS
*Director of the United States Patent and Trademark Office*